United States Patent
Conchieri et al.

(10) Patent No.: US 6,697,697 B2
(45) Date of Patent: Feb. 24, 2004

(54) EFFECTIVE CHANNEL LENGTH CONTROL USING ION IMPLANT FEED FORWARD

(75) Inventors: Brian P. Conchieri, Essex Junction, VT (US); Steven M. Ruegsegger, Jericho, VT (US); John J. Ellis-Monaghan, Grand Isle, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/192,386

(22) Filed: Jul. 9, 2002

(65) Prior Publication Data

US 2002/0182757 A1 Dec. 5, 2002

Related U.S. Application Data

(62) Division of application No. 09/812,006, filed on Mar. 19, 2001, now Pat. No. 6,482,660.

(51) Int. Cl.[7] .......................... G06F 19/00; H01L 21/00
(52) U.S. Cl. ........................ 700/121; 700/28; 700/44; 700/90; 438/800; 438/5
(58) Field of Search ................ 700/28, 44, 90, 700/121; 438/5, 514, 800

(56) References Cited

U.S. PATENT DOCUMENTS

| | | |
|---|---|---|
| 4,404,576 A | 9/1983 | Ronen |
| 4,420,870 A | 12/1983 | Kimura |
| 4,649,638 A | 3/1987 | Fang et al. |
| 5,270,234 A | 12/1993 | Huang et al. |
| 5,395,773 A | 3/1995 | Ravindhran et al. |
| 5,747,936 A * | 5/1998 | Harrison et al. ........ 315/111.81 |
| 5,759,901 A | 6/1998 | Loh et al. |
| 5,763,285 A | 6/1998 | Yang |
| 5,773,348 A | 6/1998 | Wu |
| 5,863,824 A | 1/1999 | Gardner et al. |
| 5,912,487 A | 6/1999 | Hong |
| 5,946,579 A | 8/1999 | Fulford, Jr. et al. |
| 5,949,105 A | 9/1999 | Moslehi |
| 6,304,999 B1 * | 10/2001 | Toprac et al. .................. 716/4 |

FOREIGN PATENT DOCUMENTS

JP 409045274 A 2/1997

* cited by examiner

*Primary Examiner*—Jayprakash N. Gandhi
(74) *Attorney, Agent, or Firm*—Delio & Peterson, LLC; Kelly M. Reynolds; William D. Sabo

(57) ABSTRACT

The present invention discloses the use of ion implant recipe changes to control the effective channel length by compensating for any variation in the gate electrode width. The invention provides a method for controlling the effective channel length in FETs by measuring the gate electrode width, sending the measured gate electrode width to an ion implant controller, calculating a desired ion implant condition which compensates for any deviation in the effective channel length from target, and subsequently selecting or generating an ion implant recipe based on the desired conditions. Such ion implant recipe is then implanted into the FET to control the effective channel length by defining the halo, LDD, source, drain, or any other doped regions of the device which define the effective channel length, thereby resulting in a manufacturing process with higher yields and less scrap.

18 Claims, 8 Drawing Sheets

EFFECTIVE CHANNEL LENGTH CONTROL USING ION IMPLANT FEED FORWARD

This is a divisional of application Ser. No. 09/812,006 filed Mar. 19, 2001, now U.S. Pat. No. 6,482,660.

BACKGROUND OF THE INVENTION

1. Field of the Invention

The present invention relates generally to semiconductor devices, more particularly to a method and system for controlling and maintaining an effective channel length in a semiconductor device by adjusting ion implant conditions derived from a fed-forward measurement of the gate electrode.

2. Description of Related Art

Over the years, in order to keep up with modern technology, it has been indispensably necessary to reduce semiconductor device size as well as enhance performance thereof. Semiconductors which have been decreased in size over the years have included, but are not limited to, field effect transistors (FETs), metal oxide semiconductor FETs (MOSFETs), complementary metal oxide silicon FETs (CMOS FETs), and the like. However, in decreasing feature sizes of the modern semiconductors, the bearable error of feature size control tolerances have also been reduced. As feature size control tolerances decrease, the ability to produce FETs with smaller specifications becomes increasing difficult, and as such, the normal random variances produced by such FETs provides undesirable semiconductor circuits.

In a conventional semiconductor, such as a FET, current flows along a semiconductor path called a channel. FIG. 1A illustrates a typical example of a CMOS device 20 comprising an NFET 1 and a PFET 2, while FIG. 1B illustrates the left half NFET 1 and the right half PFET 2 superimposed. As further illustrated, the conventional CMOS FET 20 has a gate electrode 3 having a gate width 21. The gate electrode may be offset by a variety of spacers, such as, spacers 4, 5, and 6, whereby the spacer 4 may define an ion implantation mask for creating a lightly doped drain (LDD) region 11, or an extension of the NFET 1, while spacer 5 may define an ion implantation mask for creating a LDD region 12 of the PFET 2. Spacer 6 may define an ion implant mask of both FETs for creating a source region 13 and drain region 14 of the substrate for both FETs. The gate electrode 3 lies over a thin gate insulator film 8, wherein the gate is positioned above and between shallow trench isolation regions 9 ("STI"). Therebetween the shallow trench isolation regions 9 lies LDD regions 11 and 12, whereby the region of substrate located between LDD regions 11 and 12, under the gate electrode 3, constitutes the channel. As will be recognized, when the gate electrode 3 is turned "on," a depletion zone 17 forms in the channel whereby the region of substrate surface under the gate electrode 3, between edges of the depletion zone 17, is called an effective channel length 18 of the FET.

In a FET, any variation between a desired gate electrode width and the actual formed gate electrode width has a first-order effect on the effective channel length, while the effective channel length has a first-order effect on the drive current of the FET. Likewise, the drive current of the FET has a first-order effect on the speed of the resultant circuit having an effect on the maximum clocking frequency. As will be recognized, a circuit's value, performance, and consumer desirability are typically determined by the maximum clocking frequency of the resultant circuit. Thus, the effective channel length of a FET affects the resultant circuit's overall performance, value, and desirability. Therefore, as feature sizes of the modern semiconductors continue to decrease, and therewith the control of the tolerable feature error, any variation between a desired gate electrode width and the actual, as-formed gate electrode affects the underlying effective channel length, thus affecting the clocking frequency to provide a circuit having decreased value and desirability.

Therefore, a need exists in the art to control the effective channel length to provide a manufacturing process that provides FETs, and thus circuits, to meet desired specifications. Prior art is aimed at controlling the effective channel length using Rapid Thermal Anneal (RTA) or drive-in process steps, whereby any variation of the actual gate electrode from the ideal gate electrode may be corrected by adjusting RTA time or temperature using a downstream process. However, adjusting RTA time or temperature using downstream processes can be problematic with other device parameters including overlap capacitance, increasing the thermal budget, and affecting both NFET and PFET as well as all dopant simultaneously, for example. As a result of modern semiconductors having smaller effective channel lengths, and thus being at an increased sensitivity to overlap capacitance due to the associated reduced tolerable feature error and thermal cycle budget, adjusting RTA time or temperature using downstream processes is not ideal for controlling a smaller effective channel length in modern semiconductors.

Prior art is also directed to controlling the effective channel length by correcting for variations in the gate electrode using techniques such as photolithography, polysilicon reactive ion etching ("RIE"), and the possible use of hardmasks for gate definition. For example, prior art is directed to techniques of controlling gate width variations by photolithography to reactive ion etching "RIE" whereby a measurement of the photoresist mask width determines an adjustment to the RIE etch-bias to control the gate width. However, as gate width dimensions continue to shrink to sub-quarter micron in modern semiconductors all available etch-bias may be used in achieving such sub-lithographic dimensions, thereby leaving no available etch-bias for later adjustments to control the smaller effective channel lengths in modern semiconductors.

Thus, as the gate electrodes of modern semiconductors continue to shrink to sub-quarter micron, typically less than 0.25 $\mu$m, it is becoming more difficult to effectively and efficiently control the associated smaller effective channel lengths, and thus more difficult to provide fast, reliable, and desirable semiconductors. Therefore, a need continues to exist in the art to provide improved systems and methods of forming, controlling and maintaining smaller effective channel lengths in modern semiconductors.

Bearing in mind the problems and deficiencies of the prior art, it is therefore an object of the present invention to provide an improved system and method of forming and controlling an effective channel length in a semiconductor.

Another object of the present invention is to provide an improved system and method for compensating for gate electrode width deviation from target.

It is another object of the present invention to provide a system and method for controlling channel length or other device parameter by compensating for gate electrode width deviation from target.

Yet another object of the present invention is to provide an improved semiconductor, such as a FET, having a gate width less than about 0.25 $\mu$m which exhibits improved yield and performance.

It is another object of the present invention to provide a more reliable, efficient, effective, and desirable FET.

Still another object of the present invention is to provide a manufacturing process that decreases variance of one or more device parameters while simultaneously increasing product yield thus decreasing scrap.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method and system of forming a semiconductor device, such as a FET, MOSFET, and CMOS, whereby a gate electrode is provided over a substrate and subsequently a dimension of the gate electrode is determined. The determined dimension of the gate electrode is then fed forwarded to a feed-forward controller wherein an ion implant recipe, including ion implant recipe comprising n-type and p-type impurities, is determined based on the gate electrode dimension, which when implanted into the substrate defines the doped regions of the substrate while simultaneously controlling the correlating semiconductor parameters of the substrate.

Preferably, the gate electrode may include polysilicon, antimony, arsenic, boron, carbon, germanium, selenium, sulfur, tellurium, gallium arsenide, and indium antimonide. The dimension of the final gate electrode is determined whereby such dimensions preferably include gate electrode width, gate electrode height, gate electrode length, gate electrode sheet resistance, gate electrode sidewall profile, and mixtures thereof. The ion implant recipe is in the feed forward controller based on the fed-forward gate electrode dimension. The determined ion implant recipe is then implanted into the substrate to define the doped regions of the substrate, preferably the halo, lightly doped drain (LDD) extensions, source and drain regions, and mixtures thereof, while simultaneously controlling correlating semiconductor parameters of the substrate including the effective channel length, overlap capacitance, cut off frequency, switching time, and mixtures thereof.

The present invention compensates for both gate electrode dimensions which are larger than a desired gate electrode dimension, as well as gate electrode dimensions which are smaller than a desired gate electrode dimension. Furthermore, both the larger and smaller gate electrodes are compensated for in a single ion implantation process based on a single measurement of the gate electrode.

In the present invention, the step of determining the ion implant recipe may comprise comparing the determined dimension of the gate electrode with a desired dimension of the gate electrode within the feed-forward controller. An ion implant condition adjustment of an ideal ion implant recipe is then determined based on any difference between the determined dimension of the gate electrode and the desired dimension. Subsequently, the ion implant recipe is determined base on the ion implant condition adjustment of the ideal ion implant recipe within the feed-forward controller. In the present invention, the ion implant condition adjustment of the ideal ion implant recipe may be determined using Response Surface Methodology (RSM) or Design Of Experiments (DOE) model.

In an embodiment of the present invention, the ion implant recipe may be selected from a set of pre-qualified ion implant recipes from within the feed-forward controller, whereby the selected ion implant recipe compensates for any perceived deviation in the determined dimension of the gate electrode from a targeted dimension of the gate electrode.

Alternatively, the ion implant recipe determined within the feed-forward controller may be a unique ion implant recipe which when implanted into the substrate compensates for any perceived deviation in the determined dimension of the gate electrode from a targeted dimension of the gate electrode. In the embodiment where the ion implant recipe comprises a unique ion implant recipe, the unique ion implant recipe is determined using a model of the semiconductor parameters based on the implantation of a nominal ion implant recipe and any calculated deviation between the determined gate electrode dimension and the targeted dimension of the gate electrode.

In the present invention, the feed-forward controller may further include a detuning means selected from the group consisting of filtering, estimation, and smoothing algorithms. Such detuning means prevents the feed-forward controller from reacting to measurement noise.

Furthermore, in the present invention, the semiconductor parameters of an NFET and a PFET may be formed and controlled simultaneously by a single step of implanting the determined ion implant recipe derived from the single gate electrode dimension. Such semiconductor parameters of the NFET and the PFET may be adjusted by differing ion implant dosages and energies based only on such single step of implanting the determined ion implant recipe derived from the single gate electrode dimension.

In a preferred embodiment, a gate electrode width is determined and forwarded to the feed-forward controller for determining the ion implant recipe based on the gate electrode width which is then implanted into the substrate to define the doped regions of the substrate while simultaneously controlling an effective channel length of the semiconductor. A lightly doped region or Halo region may be implanted into the substrate prior to doping the portion of the substrate using the adjusted ion implant recipe. In such an embodiment, the gate electrode width is determined using a mechanical measuring technique selected from the group consisting of scanning electron microscopy, reflectance measurements, atomic form microscopy, image shearing, and mechanical measurement. Alternatively, the gate electrode width may be determined using a non-mechanical measuring technique selected from the group consisting of estimation, inference, and assumption based on predetermined gate electrode width of a second, similar gate electrode.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
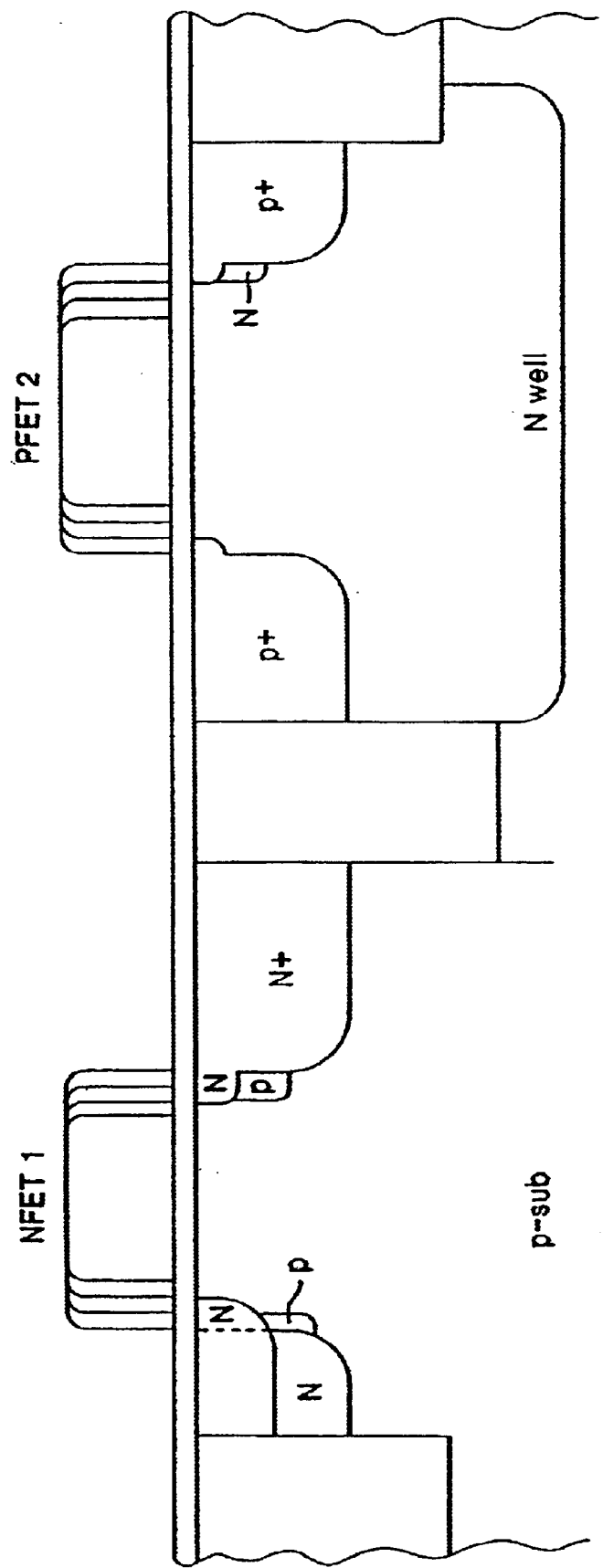
FIG. 1A is an illustrative schematic of a CMOS circuit having two components, in particular an NFET device and PFET device.
Figure 1B:
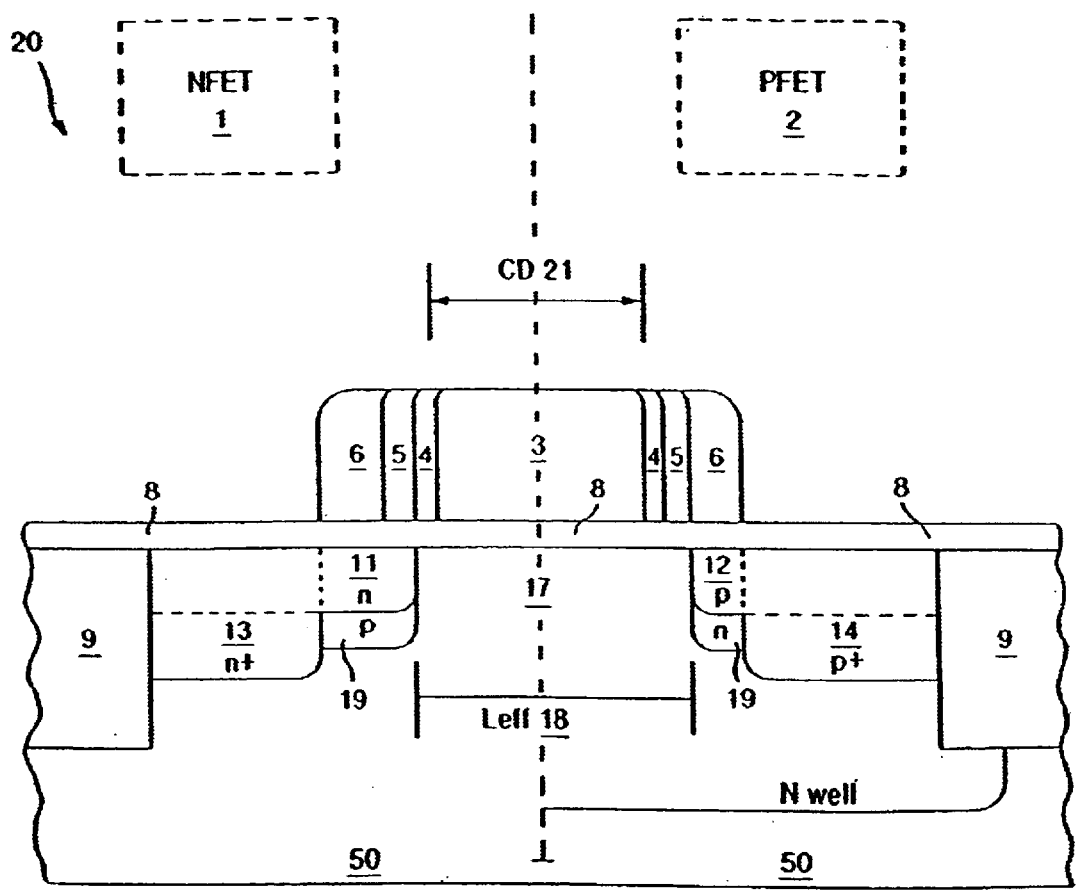
FIG. 1B is an illustrative schematic of the CMOS of FIG. 1A having the left portion of the NFET and the right portion of the PFET devices superimposed.

In describing the preferred embodiment of the present invention, reference will be made herein to FIGS. 1A–7B of the drawings in which like numerals refer to like features of the invention. Features of the invention are not necessarily shown to scale in the drawings.

The present invention discloses the use of ion implant recipe changes to control the effective channel length or other semiconductor device parameters including, for example, drive current, overlap capacitance, cut off frequency, switching time, and the like. In accordance with the present invention, a gate electrode is formed over a substrate and a dimension of the formed gate electrode is determined, whereby the dimensions include gate electrode width, gate height, gate length, gate sheet resistance, gate sidewall profile, and the like. Once the dimension of the gate electrode is determined, it is fed forward to a feed-forward ion implant control operations wherein any variation in the gate electrode dimension is compensated for based on a target or ideal of such gate electrode dimension. A recipe is determined in the feed-forward ion implant controller, and such recipe is then implanted into the substrate to define and form the doped regions of the substrate including the halo, lightly doped drains (LDD) extension, source and drain regions. In implanting the adjusted ion implantation to define such regions, the semiconductor parameters including the effective channel length, overlap capacitance, cut off frequency, switching time, and the like are simultaneously formed and controlled by such adjusted ion implantation of the doped regions of the substrate.

In the preferred embodiment, the present invention provides a method and system for forming and controlling the effective channel length in a semiconductor device, such as a field-effect transistor (FET). In accordance with the preferred embodiment, the effective channel length of the semiconductor may be controlled by an ion implant recipe implantation step derived from a calculation based on a measurement of the gate electrode. Preferably, a final gate electrode is formed over a substrate, and then a dimension of the final gate electrode is measured, preferably the gate electrode width is measured. The gate electrode measurement is fed-forward to an ion implant controller wherein ion implant conditions are determined using the measurement of the gate electrode width. The ion implant conditions determined within the feed-forward ion implant controller compensate for any deviation in the effective channel length from a targeted or ideal effective channel length of the semiconductor. The ion implant conditions are used to determine, select or generate an ion implant recipe based on the fed-forward gate electrode measurement within the ion implant operations controller. In the preferred embodiment of the present invention, the ion implant recipe is an adjustment of the nominal ion implant dopant conditions which, when implanted into the semiconductor defines the doped regions, i.e. the halo, LDD, source and drain, and any other doped regions of the semiconductor, thereby simultaneously forming and controlling the effective channel length. The adjusted ion implant recipe based on the fed-forward measurement of the gate of the present invention both forms and regulates the effective channel length of the semiconductor by removing any perceived deviation in the actual, as-formed gate electrode from an ideal gate electrode to provide the semiconductor device with improved speed and performance yields.

Preferably, the measurement of the gate electrode is determined after forming and etching the gate electrode, thereby measuring a dimension of the final gate electrode, such as the final gate electrode width. Furthermore, in accordance with the present invention, the effective channel length of the NFET and PFET devices may be formed and controlled simultaneously, or independently of each other thereby adjusting the NFET and PFET channel lengths independently with different ion implant dosages to provide the ability to match the NFET and PFET devices together, or alternatively to strengthen or weaken the NFET and PFET devices independently.

The present invention may be better understood in accordance with the description of the preferred embodiment below. In accordance with the present invention, the measurements of the gate electrode comprise those measurements including the gate electrode width (the critical dimension or CD), the gate height, gate length, gate sheet resistance, gate sidewall profile, and mixtures thereof. The term doped regions of the substrate comprise doped regions including the halo regions, lightly doped regions (LDD) regions, the source and drain regions, and mixtures thereof. Further, the parameters of the semiconductor which may be controlled in accordance with the present invention comprise those parameters including the effective channel length, overlap capacitance, cut-off frequency, switching time, and mixtures thereof. As will be recognized, other gate electrode measurements as known and used in the art may be determined to dope other known regions of the substrate thereby defining correlating known semiconductor parameters in accordance with the description of the present invention.

As will be recognized by one skilled in the art, the present invention may be used to form a variety of semiconductor devices such as, for example, a FET, MOSFET, CMOS, and the like, as well as semiconductors having p-channels or n-channels which may be formed independently of each other, or alternatively, simultaneously. The present invention advantageously allows the NFET channel length and the PFET channel length to be adjusted by differing ion implant dosages, energies, and the like, based only on the same measurement of the gate electrode.

Figure 2A:
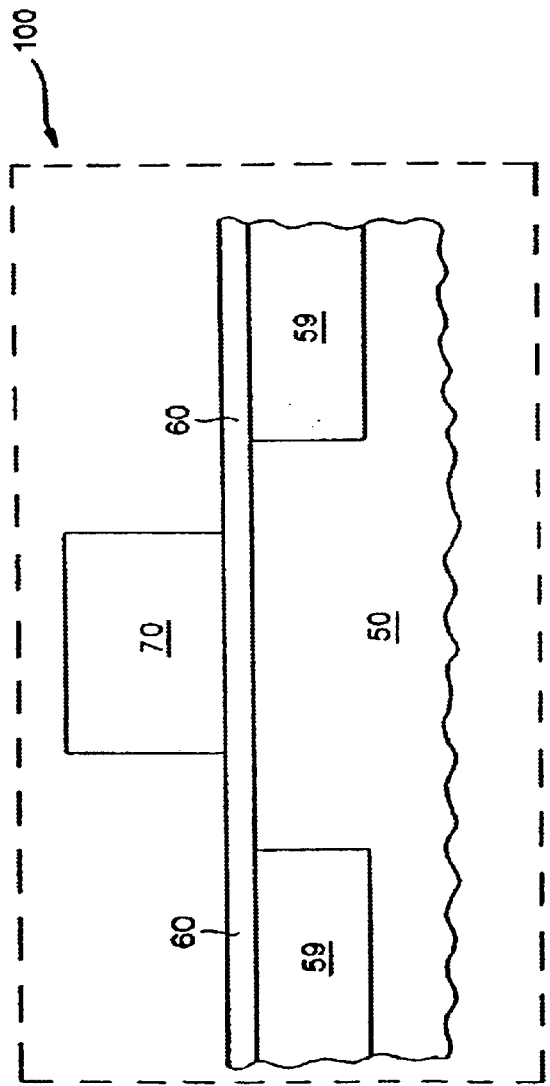
FIG. 2A is a cross-sectional view of step 100 of the present invention of forming a final gate electrode having gate electrode width.

In the preferred embodiment of the present invention, as illustrated in FIG. 2A, an initial gate electrode is formed over a substrate 50 having a dielectric layer 60 thereover, and subsequently etched to provide a final gate electrode 70 over the dielectric layer 60. The substrate 50 may comprise a silicon substrate, silicon SOI, SiGe (silicon germanium) and the like, having the dielectric layer 60 deposited thereover a surface thereof comprising a dielectric material including an oxide, thermally grown silicon dioxide, spun-on resin, fluorinated $SCO_2$, silk, polyimide, and the like. A gate material include polysilicon, antimony, arsenic, boron, carbon, germanium, selenium, sulfur, tellurium, gallium arsenide, indium antimonide, the oxides of most metals, and the like, is deposited over the gate dielectric layer 60 by known techniques to form an initial gate electrode. The initial gate electrode is then patterned and etched using techniques as known and used in the art, including etching, photolithography, RIE processes, hard mask processes, damascene processes, and the like, thereby defining and forming the final gate electrode 70, as shown in FIG. 2A. In the present invention, the final gate electrode may be provided with a variety of profiles as known and used in the art, including vertical walls, a notched base profile as illustrated in FIG. 2C, and the like. See FIGS. 2A–C.

In the preferred embodiment, a final polysilicon gate electrode 70 is provided thereover a dielectric layer 60 over a silicon substrate 50, whereby the polysilicon gate electrode 70 is positioned thereover and between shallow trench isolation regions 59 of the substrate 50. See FIG. 2A.

Figure 2B:
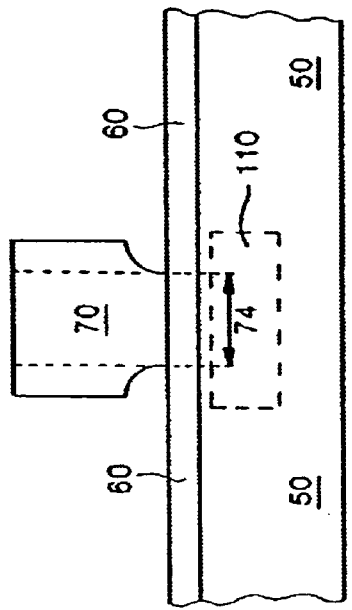
FIG. 2B is a cross-sectional view of step 110 of the present invention illustrating measuring the gate electrode width, or critical dimension (CD), of the gate electrode formed in step 100 of FIG. 2A.
Figure 2C:
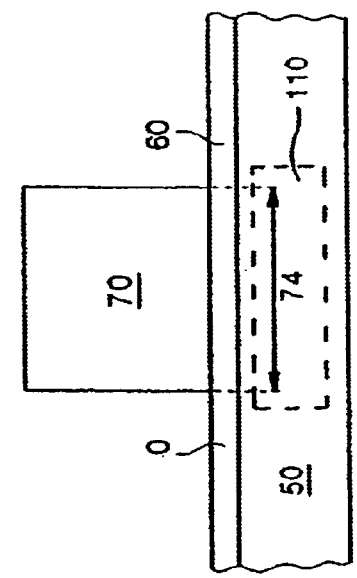
FIG. 2C is a cross-sectional view of steps 100 and 110 of the present invention illustrating forming a gate electrode, whereby the gate electrode may have a notched base profile, and subsequently measuring the gate electrode width of the notched base gate.

After the final gate electrode 70 is formed, a non-destructive measurement "M" 74 of the actual, as-formed final gate electrode 70 is determined as illustrated by step 110 within the dashed lines of FIGS. 2B and 2C. In accordance with the present invention, the critical dimension measurement "M" 74 of the gate electrode is defined as the measurement of the dimension of the gate electrode including, gate electrode width, gate height, gate length, gate sheet resistance, gate sidewall profile, and the like. In the preferred embodiment, a non-destructive measurement "M" 74 of the gate electrode width is determined whereby the gate width is determined at a bottom surface of the gate, or at the contact area where a surface of the gate electrode 70 meets the dielectric layer 60. The non-destructive gate electrode width measurement "M" 74 may be determined directly or indirectly. In the preferred embodiment, in determining the measurement "M" 74 of the gate electrode width in step 110, such measurement "M" may be determined directly using mechanical measurement techniques as known and used in the art including, for example, measuring the gate width at the surface of the gate electrode directly contacting the dielectric layer using a scanning electron microscope (SEM), atomic force microscope (AFM), reflec- tance measurements, interference measurements, mechanical measurement techniques, image shearing, and the like.

Alternatively, step 10 of determining the non-destructive measurement "M" 74 of the gate electrode width may be determined non-directly using non-mechanical measurement techniques including estimating, inferring, assuming, and the like, the width of the gate electrode 70 at the surface of the gate electrode directly contacting the dielectric layer using a known measurement "M" of a previously measured critical dimension of a second gate electrode which is substantially similar in dimensions or related to the desired gate electrode 70 being measured. Thus, the measurement of the gate electrode width may be determined directly or indirectly by inferring or assuming the gate electrode width measurement. Preferably, step 110 comprises directly measuring the non-destructive critical dimension, or measurement "M" 74 by measuring the gate electrode width at the surface thereof which directly contacts the dielectric layer using scanning electron microscopy (SEM), whereby such gate electrode width "M" 74 may range from about 20 nm to about 500 nm, more preferably from about 50 nm to about 150 nm.

Figure 3:
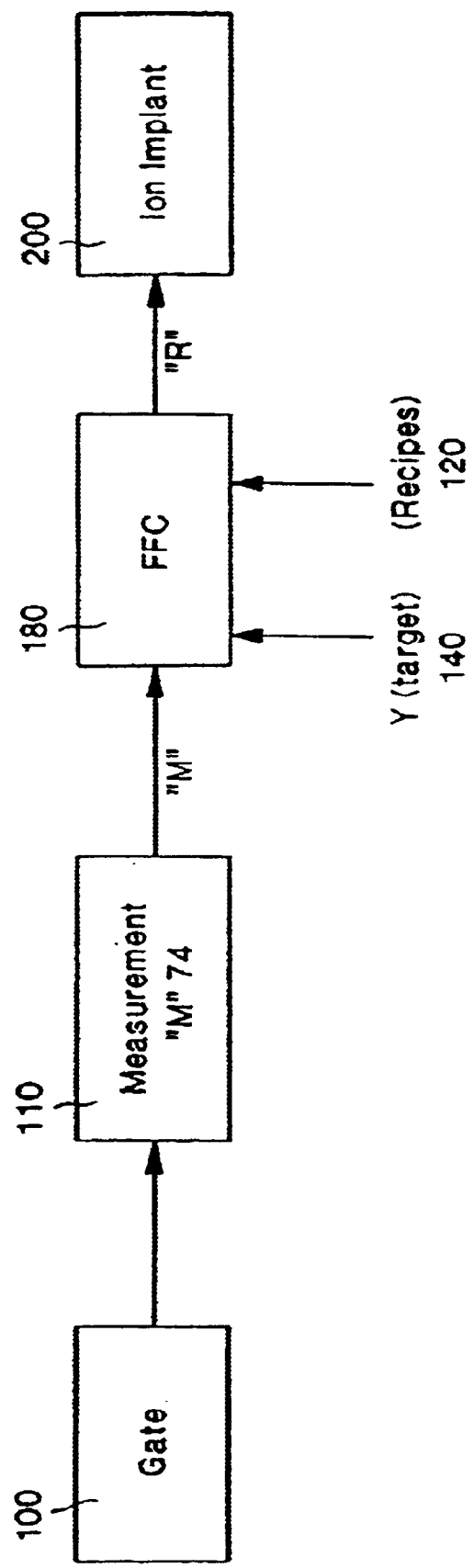
FIG. 3 illustrates a partial flow-chart of an exemplary high-level process flow of the present invention for forming and controlling an effective channel length by ion implantation which compensates for any deviation between an ideal or desired gate electrode width and the actual, as-formed gate electrode width.

Thus, as discussed above and as illustrated in more detail in the exemplary high-level process flow of the preferred embodiment in FIG. 3, step 100 defines the final gate electrode 70, and subsequently, a measurement "M" 74 of the final gate electrode is measured and/or determined in step 110 whereby such measurement is used to provide subsequent control of the effective channel length, as well as other device parameters as discussed above, by implanting adjusted doped regions of the substrate, such as the halo, LDD, source and drain regions, and the like. After the measurement "M" 74 of the gate electrode 70 is determined, FIG. 3 illustrates feeding forward the measurement "M" to a downstream feed-forward controller (FFC) 180 which compares the measurement "M" 74 to the desired target and subsequently determines a recipe adjustment to the ion implant process. In the above step, the feed-forward controller may include the feed-forward controllers as known and used in the art such as, for example, factory control inventory software. The ion implant tools may include those as known and used in the art including, for example, the E220 distributed by Varian, Inc., of Glouchster, Mass. In accordance with the present invention, the present invention may be employed using varying dimensions of the gate electrode including gate electrode width, gate height, gate length, gate resistance, gate sidewall profile, and the like, whereby such dimensions may be fed-forward to known ion implant operations controllers which are adapted to adjust such dimensions for providing adjusted ion implant recipes, which when implanted into the substrate, define the doped regions of the substrate, thereby simultaneously forming and controlling semiconductor device parameters correlating to such varying dimensions of the gate electrode including the effective channel length, overlap capacitance, cut-off frequency, switching time, and the like. Preferably, the gate electrode measurement "M" 74 of step 110 is fed forward to a feed-forward controller for determining an adjustment to ion implant conditions of the substrate which define the doped regions of the substrate while simultaneously controlling the effective channel length of the semiconductor.

In accordance with the preferred embodiment of the present invention, the measurement "M" 74 is input into the feed-forward controller in step 180 along with a desired effective channel length target ($Y_{target}$) and optionally a set of predetermined, pre-qualified ion implant recipes "R1, R2 . . . Rn", sub-steps 140 and 170 respectively of the feed-forward control step 180. See FIGS. 3 and 4. Subsequently, in step 180, the measurement "M" 74 of the gate electrode is provided into a model 130, processed within the model 130, and the processed output compared to the desired effective channel length target ($Y_{target}$) 140 for selecting, determining, or calculating ion implant conditions whereby such ion implant conditions are used for selecting, determining, or calculating an-ion implant recipe "R" 185 which sets the ion implant conditions of the doped portions of the semiconductor such that the effect of ion implantation of the recipe "R" 185 in step 200 compensates for any perceived deviation in the critical dimension measurement of the final gate electrode from a targeted critical dimension measurement of a desired final gate electrode. The process model controller of step 180 may determine a unique adjusted ion implant recipe "R" 185 or may select a prequalified adjusted ion recipe "R" 185 from the set of pre-qualified recipes "R1" 170*a*, "R2" 170*b* . . . "Rn" 170*n* in sub-step 170 of the feed-forward control step 180 for subsequent implantation of the doped regions of the substrate. See FIG. 4.

In doing so, the feed-forward controller of step 180 is adapted to have input into the feed-forward controller the perceived critical dimension deviation while also being adapted to output a qualified ion implant recipe "R" 185 that has the effect of regulating the effective channel length, or other device parameters including, drive current, cut-off frequency, switching time, and the like in the presence of such perceived critical dimension deviation or other gate dimension measurements. Thus, the adjusted ion implant recipe "R" 185 of the present invention is a modification of the nominal ion implant conditions which compensates for the as-formed, final gate dimensions which, when implanted into the substrate in step 200 define, control, and regulate the effective channel length by removing any perceived deviation in the determined gate electrode width.

Adjustments to the ion implant conditions in step 180 may include, for example, the ion implant dosage, ion implant energy, ion implant tilt, and the like, whereby the ranges of such adjustments may range from about −50% to about +50% of the nominal ion implant conditions, preferably from about −10% to about +10% of the nominal ion implant conditions. In accordance with the present invention, the specific range of the adjustments to the ion implant conditions depends on both the particular ion implantation as well as the ion implant parameters. Preferably, the ion implant recipe "R" 185 of the doped regions implanted in step 200 include adjusted ion implants of the halo, LDD, and source and drain regions of the substrate, implanted therebetween the shallow trench isolation regions 59, to form and control the effective channel length or other device parameters as discussed above.

Figure 4:
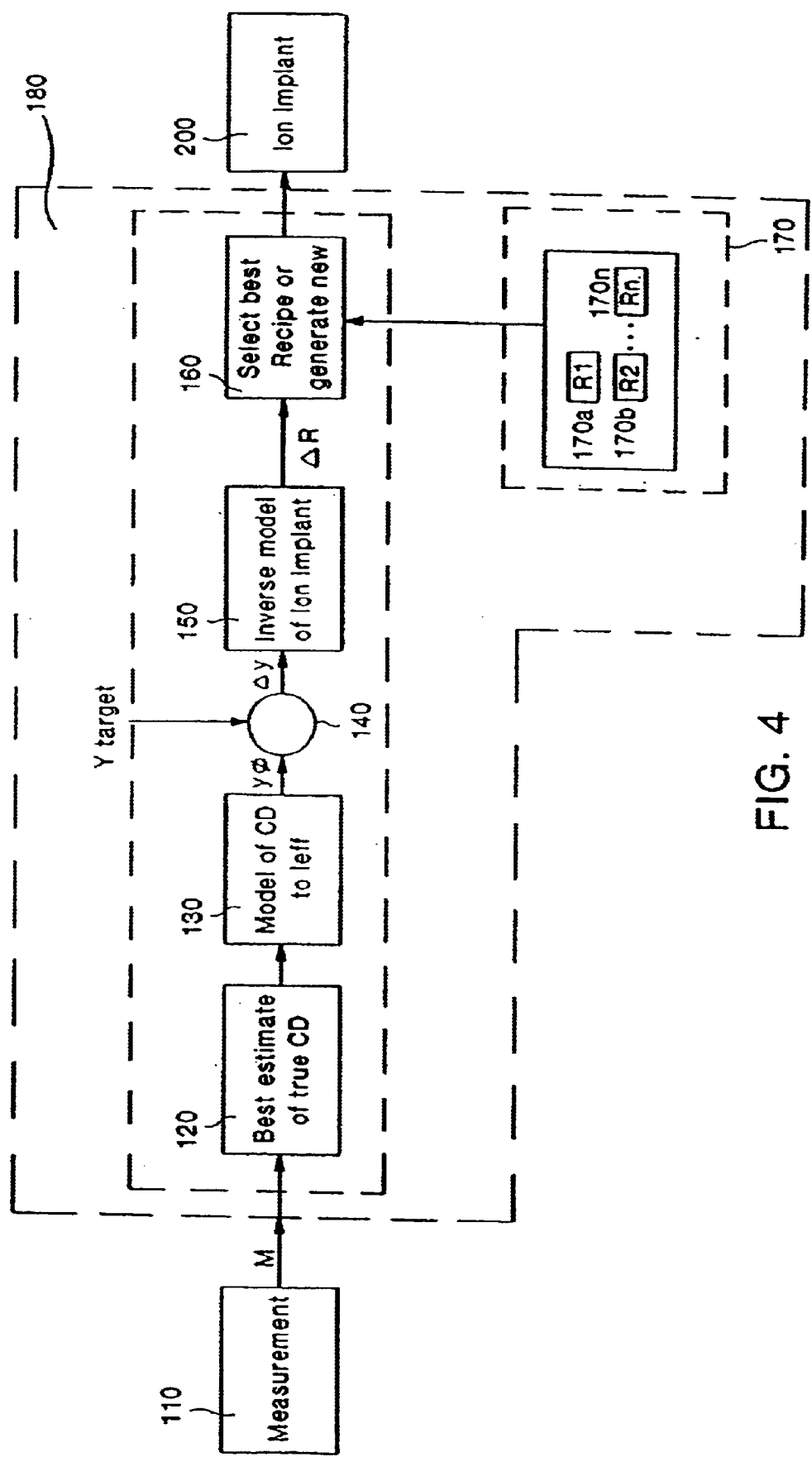
FIG. 4 is a partial flow-chart of the exemplary process of FIG. 3 illustrating exemplary sub-steps of step 180 wherein the gate electrode width measurement is fed-forward to a feed-forward controller for determining an adjusted ion implant recipe "R" based on the fed-forward measurement of the gate electrode width for controlling the effective channel length of the semiconductor.

As illustrated in more detail in FIG. 4, step 180 of feeding forward the critical dimension measurement "M" to the process model feed forward controller may further include a plurality of sub-steps such as sub-steps 120–170. Preferably, once the critical dimension measurement "M" 74 is fed-forward in step 180, a best estimate of the true critical dimension measurement "M" 74 of the gate electrode is determined based on the nominal critical dimension measurement "M" 74 in sub-step 120. In the preferred embodiment, the best estimate of the true gate electrode width of sub-step 120 is determined based on the width measurement of the final gate electrode 70. In determining the best estimate of the true critical dimension, the measured critical dimension measurement "M" 74 may be taken as an accurate reflection of the true gate electrode dimension, such as an accurate reflection of the true gate electrode width. Alternatively, the best estimation of the true critical dimension may be determined by filtering and/or estimation techniques as known and used in the art including, for example, using detuning variables of a known measurement of the noise and/or process noise such as Minimum Mean Square Error (MMSE), Maximum Likelihood Estimation (MLE), or Bayesian Estimation Theory, and the like, for example. Preferably, such proper filtering and/or estimation techniques as known and used in the art are employed in the present invention to prevent the feed-forward ion implant controller from reacting with such measurement noise and/or process noise, thereby allowing the feed-forward ion implant controller to provide an accurate adjustment to the ion implantation recipe. For example, proper filtering and estimation techniques may be used to correct critical dimension measurements "M" which inaccurately incorporate too large a random noise variable. In the preferred embodiment, the best estimation of the true critical dimension of the measurement "M" may require filtering whereby recipe selection is used as a filtering mechanism as discussed further below.

After the measurement "M" 74 of the gate electrode width has been filtered to determine the best estimate of the true critical dimension measurement "M" 74 in sub-step 120, the best estimate of the true critical dimension measurement is input into sub-step 130 to determine an estimation of a resultant effective channel length by using a nominal ion implant recipe, or a model of the effective channel length using the best estimate of the true critical dimension measurement. (See FIG. 4.) In doing so, the best estimate of the true critical dimension measurement "M" 74 is used to determine a compensating ion implant recipe of the doped regions using known techniques. A model of the effective channel length based upon a set of ion implant recipe conditions is then determined using modeling techniques as known and used in the art including Response Surface Methodology (RSM), Design Of Experiments (DOE), and the like. In doing so, the best estimate of the resultant effective channel length in sub-step 130 indicates any deviations in the final gate electrode from a targeted final gate electrode, preferably any deviations in the final gate electrode width from target. It may be determined that the actual, as-formed gate electrode width of the gate being measured is larger, i.e. wider, than the ideal gate width, or alternatively the gate width measurement may be smaller, i.e. narrower, than the ideal gate width. Thus, it may be determined in sub-step 130 of step 180 that the critical dimension "M" of the final gate electrode width may not be equivalent to a desired or ideal gate electrode width thereby requiring correction.

Subsequently, deviations of the critical dimensions of the gate electrode from target are corrected by inputting the targeted or ideal effective channel length target "Y (target)" into the feed-forward controller in sub-step 140 of step 180. The estimated effective channel length measurement of sub-step 130 is then deducted or subtracted from the targeted or ideal effective channel length "Y (target)" of sub-step 140 by known techniques to obtain a deviation from the target or ideal effective channel length "ΔY" of the semiconductor. The deviation from the targeted or ideal effective channel length "ΔY" is then input into sub-step 150 for determining an inverse model of the ion implant conditions of the doped regions of the substrate which represents an adjustment, or correction, of the ion implant conditions "ΔR" of the ideal ion implant recipe. Thus, the determined final gate width measurement of sub-step 130, requiring correction, may be corrected in step 180 by adjusting the ion implant dose and/or energy of the doped regions, by the ion implant condition adjustment "ΔR", of the substrate thereby correcting any variations in the final as-formed gate width from target, whereby once such adjusting ion implant dose and/or energy is implanted into the substrate, it simultaneously defines such doped regions of the substrate while controlling the effective channel length of the substrate.

Figure 5:
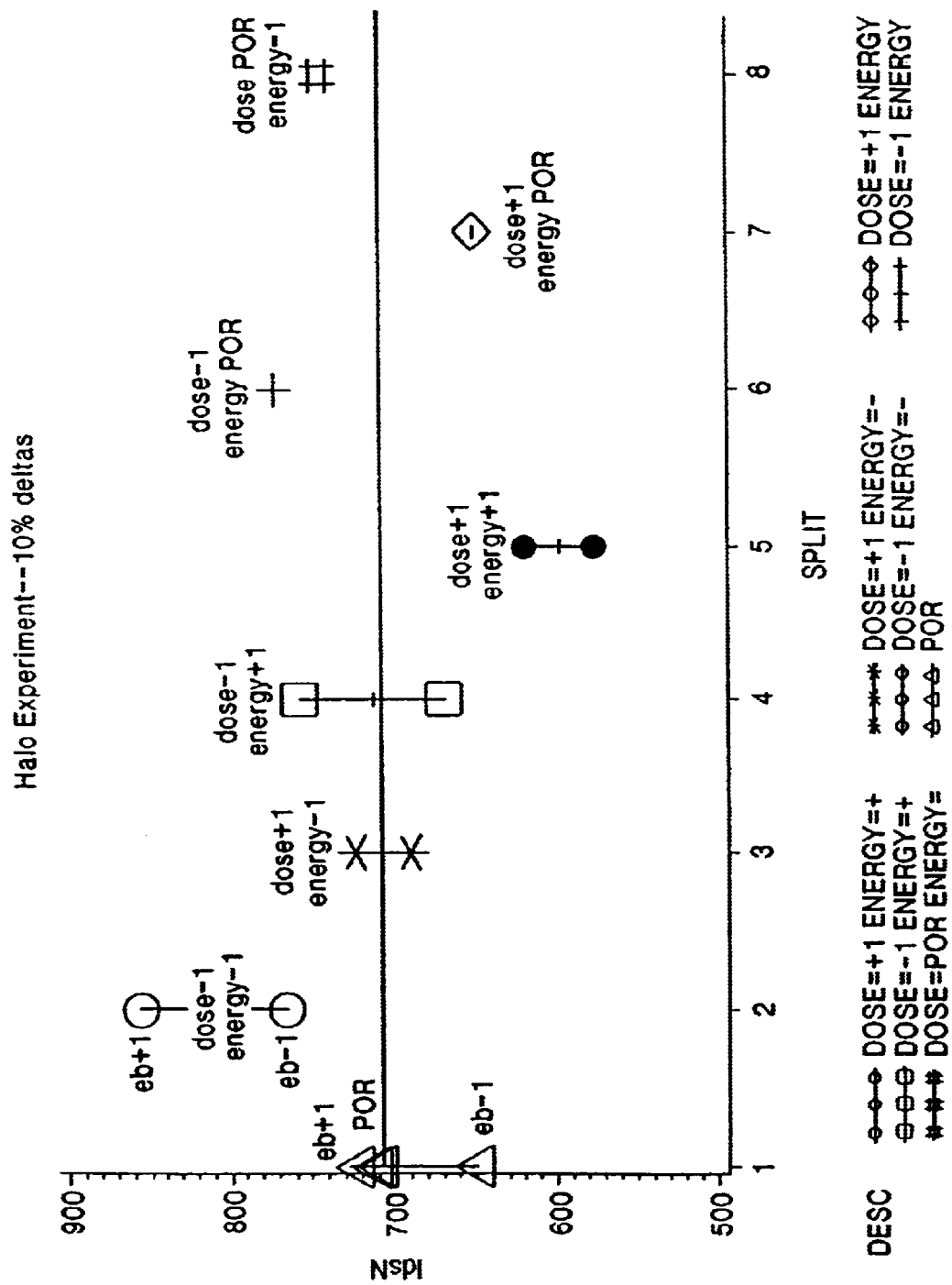
FIG. 5 illustrates the results of a design of experiments (DOE) of a halo implantation in accordance with the present invention.
Figure 6:
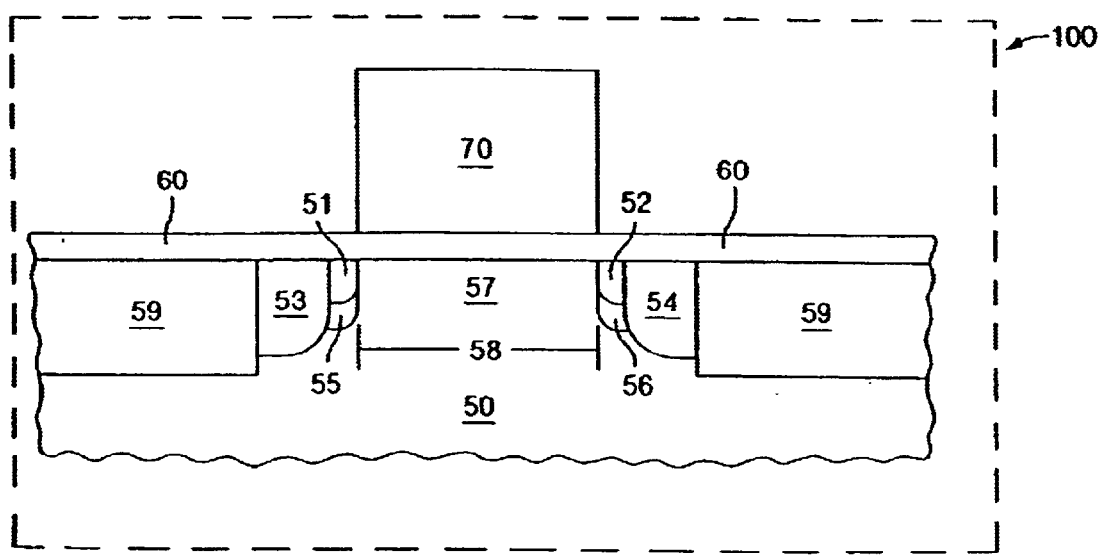
FIG. 6 illustrates a semiconductor FET having a controlled effective channel length forming and controlling by ion implantation which compensates for any deviation between an ideal or desired gate electrode width and the as-formed gate electrode width made by the exemplary high-level process flow of FIGS. 3 and 4.

In the present invention, the ion implant condition adjustment "ΔR" of the ideal ion implant recipe may be determined or calculated using a model of the ion implant conditions to effective channel length, for example. (See FIG. 5). As illustrated in FIG. 5, the ion implant condition adjustment "ΔR" of the ideal ion implant recipe may be determined or calculated using Response Surface Methodology (RSM), or alternatively a Design Of Experiments (DOE) model process performed on a microprocessor for the effect of Halo ion implantation on a device drain saturation current, Idsat, as a function of implant dosage changes. Device current is highly correlated to the effective channel length, whereby any change in current reflects a similar change in the effective channel length. In the experiment of FIG. 5, wherein the actual gate width is larger or wider than the ideal gate width, an ion implant recipe with a lower dose and/or energy may be calculated or selected to buy back an improvement in the Idsat, thus resulting in a faster FET that will otherwise be too slow without the ion implant adjustment. Alternatively, if the gate width is smaller or narrower than the ideal gate electrode, the implant can be adjusted with a higher dosage and/or energy reducing the Idsat and thereby increasing the channel length. As illustrated in the example of determining the ion implant condition adjustment "ΔR" of the ideal ion implant recipe in FIG. 5, if the gate electrode width measurement "M" 74 is larger than desired, a "split 6" may be selected for providing a lower dose and/or energy thus buying back an improvement in Idsat therein correcting for the larger or wider gate electrode width measurement than a desired or ideal gate width. Therefore, the inverse of the Design of Experiments model of FIG. 5 may be used to determine or calculate "ΔR".

Subsequently, the ion implant recipe "R" 185 is selected, generated, calculated, or determined in sub-step 160. In the present invention, sub-step 160 of determining, calculating, and/or selecting the ion implant recipe "R" 185 may be performed by a variety of techniques as known and used in the art. In one embodiment of sub-step 160 of the present invention, the parameters of the adjusted ion implant recipe "R" 185 may be determined, calculated, and/or selected in sub-step 160 based on the adjustment of the ion implant conditions "ΔR" in combination with the nominal ion implant recipe. For example, if the nominal energy is 75 KeV and AR is determined to be 5 KeV, then the new recipe R would have an energy of 80 KeV. The adjusted ion implant recipe "R" 185 is implanted into the substrate in step 200 to form and control the effective channel length. See FIG. 4.

Alternatively and preferably, the ion implant recipe "R" 185 is selected in sub-step 160 of the present invention from the set of pre-determined, pre-qualified recipes in sub-step 170 for controlling and forming the effective channel length of the preferred embodiment. As such, an ion implant recipe or parameter, in sub-step 160 of the feed-forward step 180, may be selected from the plurality of pre-qualified recipes 170 "R1, R2, . . . Rn" or parameters whereby each pre-qualified ion implant recipe 170 has a known effect on the effective channel length as compared to the nominal ion implant recipe. In the preferred embodiment, sub-step 160 selects an ion implant recipe from the set of pre-qualified ion implant recipes "R1" 170*a*, "R2" 170*b* . . . "Rn" 170*n* which most closely matches the ion implant condition adjustment "ΔR" to obtain an effective channel length as close to the ideal effective channel length as possible. For example, if the nominal recipe is 75 KeV and "ΔR" is determined to be 5 KeV and the recipe choices are 69 KeV, 75 KeV, and 81 KeV, the closest recipe to the nominal recipe which does not exceed the ideal recipe may be selected. Alternatively, the recipe with the smallest magnitude delta, 81 KeV, may be selected. Still further, the desired recipe may be selected based upon the particular conditions for controlling and forming the particular semiconductor parameters including the effective channel length, overlap capacitance, cut-off frequency, switching time, and the like.

Subsequently in step 200, as illustrated in FIG. 4, once the ion implant recipe "R" 185 has been determined the recipe "R" is subsequently implanted into the doped regions of the substrate by known techniques including, for example, Focused Ion Beam (FIB), and the like. In the preferred embodiment of the present invention, the ion implant recipe is an adjustment of the nominal ion implant dopant conditions which, when implanted into the semiconductor defines the doped regions, i.e. halo regions 55 and 56, LDD regions 51 and 52, and source and drain regions 53 and 54, thereby simultaneously forming and controlling the effective channel length 58 or other device parameter. See FIG. 6. As discussed above, when the final polysilicon gate electrode 70 is turned "on," a depletion zone 57 forms in the channel there-under the gate whereby the length of substrate surface under the gate electrode 70, between edges of the doped regions of the substrate, is the effective channel length 58 of the FET. The adjusted ion implant recipe based on the fed-forward measurement of the gate of the present invention both forms and regulates the effective channel length 58 of the semiconductor by removing any perceived deviation in the actual, as-formed gate electrode from an ideal gate electrode to provide the semiconductor device with improved speed and performance yields. The present invention may be used for implanting both p-channels and n-channels using ions including n-type dopants such as phosphorus, arsenic, gallium, antimony, or alternatively p-type dopants including boron, Indium, and the like. Thus, the present invention provides for a variety of ion implant recipes having different dosages, energies of various ions, or impact angle adjustments, thereby allowing for modification, adjustment, or regulating of the implant conditions before implantation of the doped regions of the substrate for the purpose of controlling the effective channel length or other device parameters including drive current, cut off frequency, switching time, and the like.

Figure 7A:
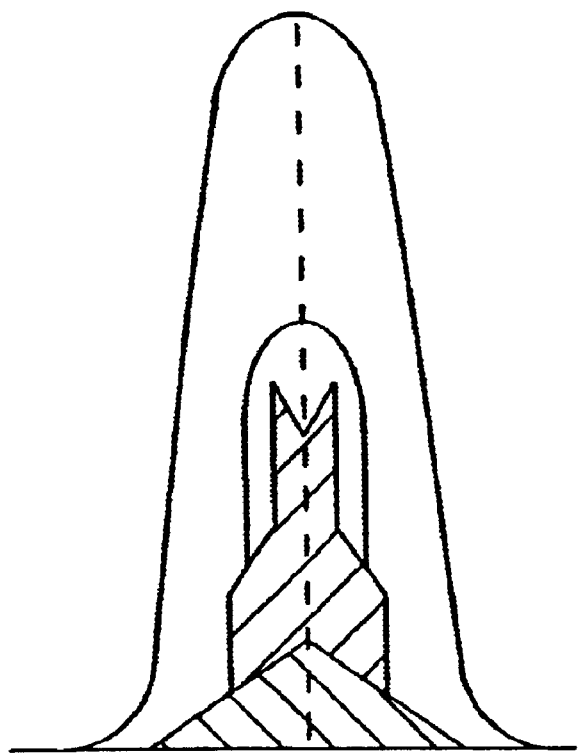
FIGS. 7A and 7B illustrate a graphical representations of variance comparisons of controlling an effective channel length in accordance with the present invention as shown in FIG. 7A which has a distribution with less variance thus being closer to a targeted effective channel length, in comparison to an effective channel length after implantation of the nominal ion implantation as shown in FIG. 7B having a larger variance thus being further from a targeted effective channel length.
Figure 7B:
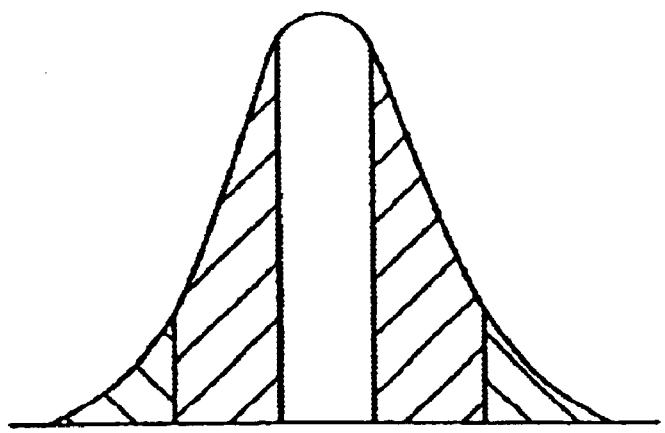

As illustrated in the variance comparisons of FIGS. 7A–B, the present invention of compensating for the determined critical dimension "M" 74 by providing an adjustment to the nominal ion implantation conditions of the doped regions of a semiconductor based on a fed-forward measurement of the gate electrode provides a manufacturing process where the effective channel lengths of the FETs, circuits, and chips have a distribution with less variance as shown in FIG. 7A. That is, the distribution is "thinner" in comparison to the distribution of the effective channel length after implantation of only the nominal ion implantation, or the ion implantation recipe that would be implanted into the substrate without the use of the present invention, as illustrated in FIG. 7B. In the present invention, the amount of variance reduction from the feed-forward control is determined by a variety of factors including, but not limited to, the variance of the measurement tool, the variance of the gate definition process, the variance of the ion implant tool, and the like. It is known to one skilled in the art that feed-forward control systems may increase the output variance under certain, undesirable conditions unless proper tuning variables are designed into the system or employed. Thus as indicated by the "thinner" distribution in FIG. 7A, the present invention overcomes the prior art by providing an effective channel length with reduced variance, thereby providing a manufacturing process with higher yield, less scrap, and higher profits.

As the tolerances of the modern semiconductors continue to shrink, the yield or percentage of efficient and reliable semiconductors, having controlled effective channel length, drive current, cut off frequency, switching time, and the like, produced by conventional methods decreases, thus decreasing profits. For example, formation of a modern smaller semiconductor having gate electrode less than 0.25 µm by conventional methods may produce an actual gate CD which is smaller than the desired gate CD, thereby providing the resultant semiconductor with decreased reliability, and thus decreased value. Alternatively, the actual gate CD may be larger than the desired gate CD, thereby providing the resultant semiconductor with decreased speed, and thus decreased value.

The present invention overcomes the prior art by providing an improved method of forming and controlling semiconductor parameters including effective channel length, drive current, cut off frequency, and switching time, using a measurement of the gate electrode to calculate an ion implant recipe adjustment of the doped regions of the substrate before such doped regions are implanted into the substrate, thereby providing such semiconductor parameters with less variance and providing higher yield and less scrap which results in increased profits. The present invention also overcomes the prior art by providing a method of defining, forming and controlling the channel length of NFET and PFET devices independently rather than conventional techniques, such as adjusting RTA conditions which adjust NFET and PFET channel lengths simultaneously which provide unmatched NFET and PFET devices, as well as limit the ability to drive the devices independently if desired. Additionally, the present invention provides a method of controlling the effective channel length by compensating for gate electrodes which are either too wide or too narrow to the ideal gate electrode measurements in a single process or step, rather than requiring an additional step, such as, an additional etch trim step for controlling the effective channel length, for example. Furthermore, the present invention provides a method to increase manufacturing process capability by compensation for perceived deviations. The present invention also provides a manufacturing process that provides an effective channel length distribution with reduced variance, therefore more product is within the desired specifications, thereby providing both increased yield and profits as well as decreased scrap.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A system for controlling effective channel length in a semiconductor device comprising:

means for determining a dimension of a gate electrode over a substrate of said semiconductor device;

means for determining a desired effective channel length of said gate electrode;

means for forwarding said gate electrode dimension and said desired effective channel length target to a feed-forward controller;

means for detuning within said feed-forward controller for preventing said feed-forward controller from reacting to any measurement noise;

means for providing said feed-forward controller with a targeted gate electrode dimension;

means for determining an ion implant recipe within said feed-forward controller at least based on said gate electrode dimension and said targeted gate electrode dimension prior to implanting doped regions into said substrate; and means for implanting said ion implant into said substrate form said doped regions of said substrate, therein defining and controlling said desired effective channel length of said gate electrode.

2. The system of claim 1 wherein said gate electrode dimension includes a dimension selected from the group consisting of gate electrode width, gate electrode height, gate electrode length, gate electrode sheet resistance, gate electrode sidewall profile, and mixtures thereof.

3. The system of claim 1 further including controlling semiconductor parameters selected from the group consisting of overlap capacitance, cut off frequency, switching time, and mixtures thereof.

4. The system of claim 1 wherein said ion implant recipe is selected from a set of pre-qualified ion implant recipes, whereby said selected ion implant recipe compensates for any perceived deviation in said determined dimension of the gate electrode from a targeted dimension of said gate electrode.

5. The system of claim 1 wherein said ion implant recipe is a unique ion implant recipe which when implanted into said substrate compensates for any perceived deviation in said determined dimension of the gate electrode from a targeted dimension of said gate electrode.

6. The system of claim 1 wherein said means for controlling said effective channel length using said determined an ion implant recipe comprises implanting said ion implant recipe into said substrate thereby defining doped regions of said substrate while simultaneously controlling said semiconductor parameters of said substrate.

7. The system of claim 6 wherein said doped regions of said substrate including doped regions selected from the group consisting of halo, lightly doped drain (LDD) extensions, source and drain regions, and mixtures thereof.

8. A system for controlling semiconductor parameters comprising:

means for determining a dimension of a gate electrode over a substrate of a semiconductor device;

means for determining desired semiconductor parameters of said semiconductor device;

means for forwarding said gate electrode dimension and said desired semiconductor parameters to a feed-forward controller;

means for detuning within said feed-forward controller for preventing said feed-forward controller from reacting to any measurement noise;

means for determining a best estimate of a true gate electrode dimension based on said detuning within said feed-forward controller;

means for providing said feed-forward controller with a targeted gate electrode dimension;

means for determining an ion implant recipe within said feed-forward controller prior to implanting doped regions into said substrate, said ion implant recipe based on said desired semiconductor parameters, said best estimate of said true gate electrode dimension and said targeted gate electrode dimension; and means for implanting said ion implant recipe into said substrate to define said doped regions, therein forming and controlling said semiconductor parameters of said substrate.

9. The system of claim 8 wherein said gate electrode dimension includes a dimension selected from the group consisting of gate electrode width, gate electrode height, gate electrode length, gate electrode sheet resistance, gate electrode sidewall profile, and mixtures thereof.

10. The system of claim 8 wherein said semiconductor parameters including semiconductor parameters selected from the group consisting of effective channel length, overlap capacitance, cut off frequency, switching time, and mixtures thereof.

11. The system of claim 8 wherein said means for determining said ion implant recipe further includes:

means for comparing said determined dimension of said gate electrode with a desired dimension of said gate electrode within said feed-forward controller;

means for determining an ion implant condition adjustment of an ideal ion implant recipe based on any difference between the determined dimension of said gate electrode and said desired dimension of said gate electrode within said feed-forward controller; and means for determining said ion implant recipe within said feed-forward controller based on said ion implant condition adjustment of said ideal ion implant recipe and said desired semiconductor parameters.

12. The system of claim 11 wherein said means for determining an ion implant recipe includes selecting said ion implant recipe from a set of pre-qualified ion implant recipes, whereby said selected ion implant recipe compensates for any perceived deviation in said determined dimension of the gate electrode from a targeted dimension of said gate electrode.

13. The system of claim 11 wherein said means for determining an ion implant recipe includes determining a unique ion implant recipe within said feed-forward controller which when implanted into said substrate compensates for any perceived deviation in said determined dimension of the gate electrode from a targeted dimension of said gate electrode.

14. The system of claim 13 wherein said unique ion implant recipe is determined using a model of the semiconductor parameters based on implantation of a nominal ion implant recipe and any calculated deviation between said determined gate electrode dimension and said targeted dimension of said gate electrode.

15. The system of claim 8 wherein said detuning means is selected from the group consisting of filtering, estimation, and smoothing algorithms.

16. The system of claim 8 wherein said means for determining said gate electrode width is a mechanical measuring technique selected from the group consisting of scanning electron microscopy, reflectance measurements, atomic form microscopy, image shearing, and mechanical measurement.

17. The system of claim 8 wherein said means for determining said gate electrode width is a non-mechanical measuring technique selected from the group consisting of estimation, inference, and assumption based on predetermined gate electrode width of a second, similar gate electrode.

18. The system of claim 8 wherein said doped regions of said substrate including doped regions selected from the group consisting of halo, lightly doped drain (LDD) extensions, source and drain regions, and mixtures thereof.

* * * * *